(12) United States Patent
Makino et al.

(10) Patent No.: US 8,517,363 B2
(45) Date of Patent: Aug. 27, 2013

(54) XY STAGE DEVICE, SEMICONDUCTOR INSPECTION APPARATUS, AND SEMICONDUCTOR EXPOSURE APPARATUS

(75) Inventors: Fuminori Makino, Yokosuka (JP); Yasushi Koyanagawa, Yokosuka (JP); Ryuta Nakajima, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 745 days.

(21) Appl. No.: 12/725,821

(22) Filed: Mar. 17, 2010

(65) Prior Publication Data
US 2010/0250004 A1 Sep. 30, 2010

(30) Foreign Application Priority Data
Mar. 18, 2009 (JP) ................. P2009-065933

(51) Int. Cl.
*G05D 3/12* (2006.01)
(52) U.S. Cl.
USPC ................. 269/73; 269/58; 248/178
(58) Field of Classification Search
USPC ............. 269/60, 55, 63, 71, 91, 73, 289 R; 700/275, 302
See application file for complete search history.

(56) References Cited

U.S. PATENT DOCUMENTS 5,022,619 A * 6/1991 Mamada ............ 248/187.1
7,959,141 B2 * 6/2011 Makino .................. 269/58

FOREIGN PATENT DOCUMENTS

| JP | 11-344585 A | 12/1999 |
| JP | 3687362 B2 | 12/1999 |
| JP | 2005-195606 A | 7/2005 |
| JP | 2006287098 A | 10/2006 |
| JP | 2007-109810 A | 4/2007 |
| JP | 2007-232648 A | 9/2007 |
| JP | 2007-266585 A | 10/2007 |
| JP | 2009-016386 A | 1/2009 |
| JP | 2009-053210 A | 3/2009 |

OTHER PUBLICATIONS

Japanese Office Action application No. 2009-065933 dated Aug. 9, 2011.
Japanese Office Action application No. 2009-065933 issued Dec. 21, 2010.

* cited by examiner

*Primary Examiner* — Monica Carter
*Assistant Examiner* — Melanie Alexander
(74) *Attorney, Agent, or Firm* — Squire Sanders (US) LLP

(57) ABSTRACT

An XY stage device having an X-axis movable body which moves in the X-axis direction on a platen, and a Y-axis movable body which moves in the Y-axis direction on the platen and guides the movement of the X-axis movable body in the X-axis direction. The XY stage device includes a pair of actuators which can be provided so as to be separated from each other in the X-axis direction, and drives the Y-axis movable body in the Y-axis direction, a detector which detects the yawing angle that can be the angle of the Y-axis movable body in a rotational direction around the Z-axis, a controller which controls the driving of the pair of actuators on the basis of the yawing angle detected by the detector, and a pair of supporters which supports the Y-axis movable body on the platen. One of the pair of supporters can be a rolling guide which guides the movement of the Y-axis movable body in the Y-axis direction, and the other of the pair of supporters can be an air pad which supports the Y-axis movable body in non-contact with the platen.

8 Claims, 7 Drawing Sheets

XY STAGE DEVICE, SEMICONDUCTOR INSPECTION APPARATUS, AND SEMICONDUCTOR EXPOSURE APPARATUS

RELATED APPLICATION

Priority is claimed on Japanese Patent Application No. 2009-065933, filed Mar. 18, 2009, the entire content of which is incorporated herein by reference.

BACKGROUND OF THE INVENTION

1. Technical Field

The present invention relates to an XY stage device, and a semiconductor inspection apparatus and a semiconductor exposure apparatus including the XY stage device.

2. Description of Related Art

As a related-art XY stage device, for example, as described in Japanese Patent No. 3687362, there is known an XY stage device including an X-axis movable body (X-direction movable body) which moves in the X-axis direction on a platen, and a Y-axis movable body (Y-direction movable body) which moves in the Y-axis direction on the platen and guides the movement of the X-axis movable body in the X-axis direction. In such an XY stage device, both ends of the Y-axis movable body in the X-axis direction are respectively supported on the platen by a pair of rolling guides (rolling guide bearings) which guides the movement of the Y-axis movable body in the Y-axis direction.

Here, in the above XY stage device, as mentioned above, both ends of the Y-axis movable body in the X-axis direction are supported by the pair of rolling guides. Therefore, the yawing angle (hereinafter simply referred to as a "yawing angle") which is the angle of the Y-axis movable body in a rotational direction around the Z-axis becomes apt to depend on the attachment precision of the rolling guide. Therefore, it is difficult to control the yawing angle of the Y-axis movable body as desired.

Additionally, when both ends of the Y-axis movable body in the X-axis direction are supported by the pair of rolling guides, the Y-axis movable body is completely constrained in the X-axis direction. Therefore, there is a possibility that strain, etc. may occur in the Y-axis movable body due to thermal stress originating from a temperature change. As a result, the running precision of the X-axis movable body guided by the Y-axis movable body will deteriorate.

SUMMARY OF THE INVENTION

It is desirable to provide an XY stage device which can control the yawing angle of a Y-axis movable body as desired, and can enhance the running precision of the X-axis movable body.

According to an embodiment of the present invention, there is provided: an XY stage device having an X-axis movable body which moves in the X-axis direction on a platen, and a Y-axis movable body which moves in the Y-axis direction on the platen and guides the movement of the X-axis movable body in the X-axis direction. The XY stage device includes: a pair of actuators which is provided so as to be separated from each other in the X-axis direction, and drives the Y-axis movable body in the Y-axis direction; a detector which detects the yawing angle that is the angle of the Y-axis movable body in a rotational direction around the Z-axis; a controller which controls the driving of the pair of actuators on the basis of the yawing angle detected by the detector, and a pair of supporters which supports the Y-axis movable body on the platen. One of the pair of supporters is a rolling guide which guides the movement of the Y-axis movable body in the Y-axis direction, and the other of the pair of supporters is an air pad which supports the Y-axis movable body in non-contact with the platen.

In this XY stage device, the driving of the pair of actuators which drive the Y-axis movable body in the Y-axis direction is controlled by the controller on the basis of the yawing angle. Hence, each of the pair of actuators can be suitably controlled according to the yawing angle (for example, can be controlled so that a difference is added to respective thrusts), and the yawing angle of the Y-axis movable body can be controlled as desired. In addition, one of the pair of supporters which supports the Y-axis movable body is a rolling guide, and the other supporter is an air pad. Hence, the Y-axis movable body is not completely constrained in the X-axis direction. Therefore, for example, it is possible to avoid and suppress strain caused by, for example, thermal stress. As a result, the running precision of the X-axis movable body guided by the Y-axis movable body can be enhanced.

Preferably, the controller controls the driving of the pair of actuators so that the yawing angle becomes 0. In this case, the Y-axis movable body can be held so that the yawing angle does not change from a state of 0.

Preferably, the detector is a pair of linear scales which is provided so as to be separated from each other in the X-axis direction, and detects the position of the Y-axis movable body in the Y-axis direction. In this case, the Y-axis direction position of the Y-axis movable body can be detected, and the yawing angle can be detected on the basis of the difference between the respective detection values.

Additionally, the pair of actuators may be a pair of shaft motors.

Preferably, the air pad is constructed so that the supporting height thereof can be adjusted. In this case, it is possible to adjust the supporting height of the air pad to thereby adjust the horizontal state of the Y-axis movable body easily.

Preferably, the air pad is constructed so as to perform the spherical surface support of the Y-axis movable body. In this case, since the spherical surface support of the Y-axis movable body is performed, the strain caused in the Y-axis movable body can also be avoided even by an air pad, and as a result, the running precision of the X-axis movable body can be further enhanced.

Additionally, a semiconductor inspection apparatus according to the embodiment of the present invention includes the XY stage device. Moreover, a semiconductor exposure apparatus according to the embodiment of the present invention includes the XY stage device. In this semiconductor inspection apparatus and semiconductor exposure apparatus, it is also possible to exhibit the above operational effects that the yawing angle of the Y-axis movable body is controlled as desired, and the running precision of the X-axis movable body is enhanced.

DETAILED DESCRIPTION OF THE INVENTION

Figure 1:
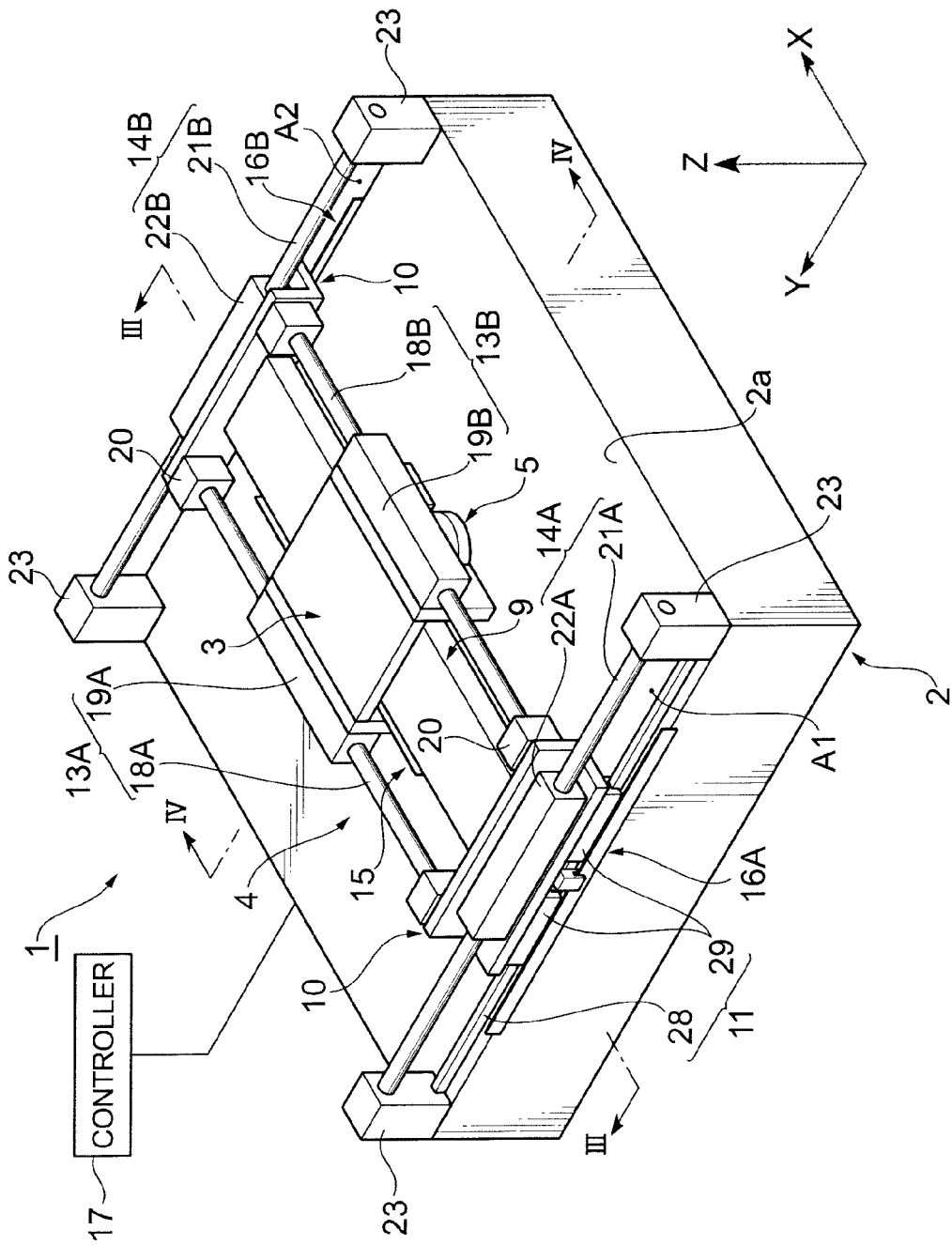
FIG. 1 is a perspective view showing an XY stage device according to one embodiment of the present invention.

A preferred embodiment of the invention will be described below in detail with reference to the accompanying drawings. In addition, in the following description, the same reference numerals will be given to the same or equivalent elements, and duplicate description will be omitted.

Figure 2:
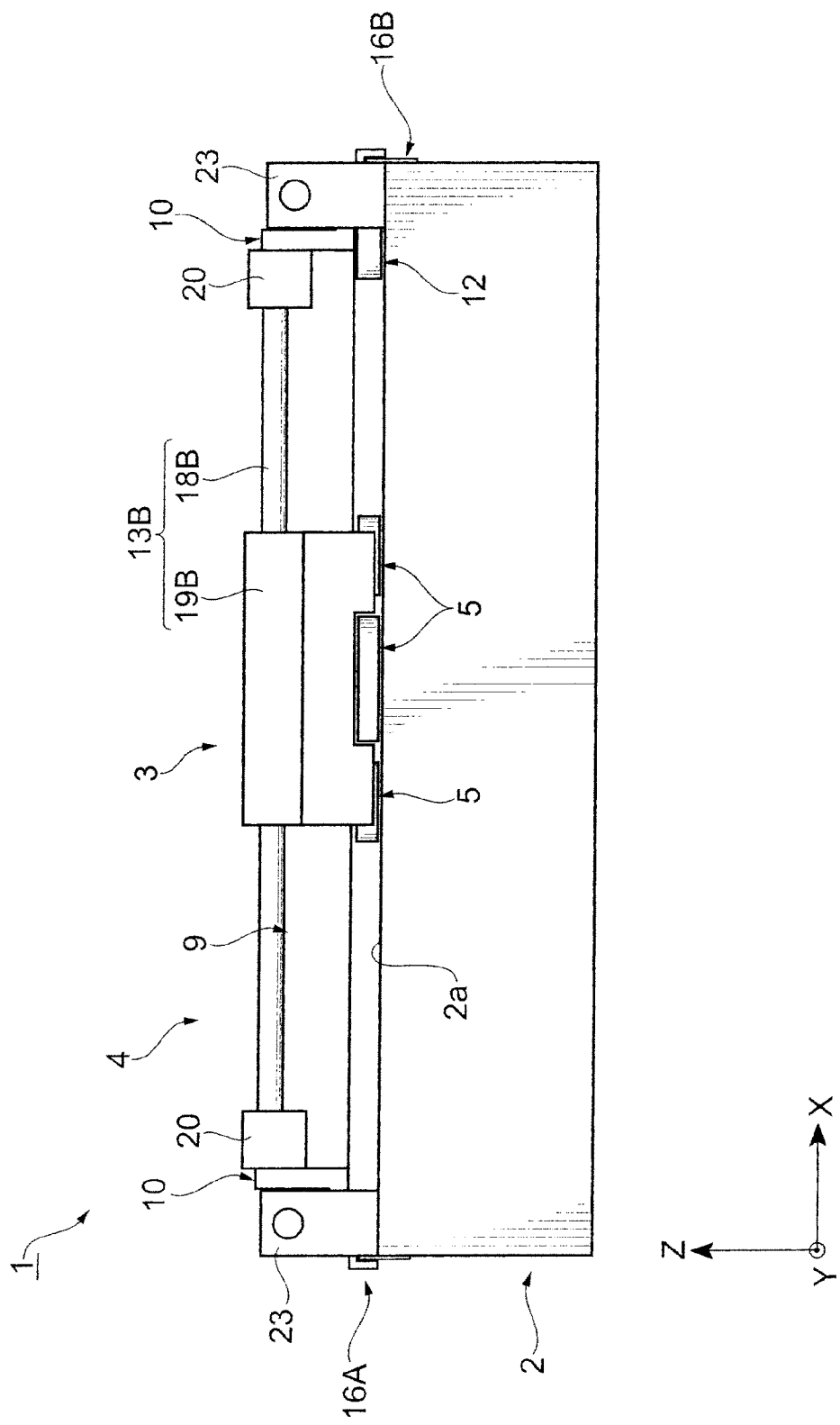
FIG. 2 is a side view showing the XY stage device of FIG. 1.
Figure 3:
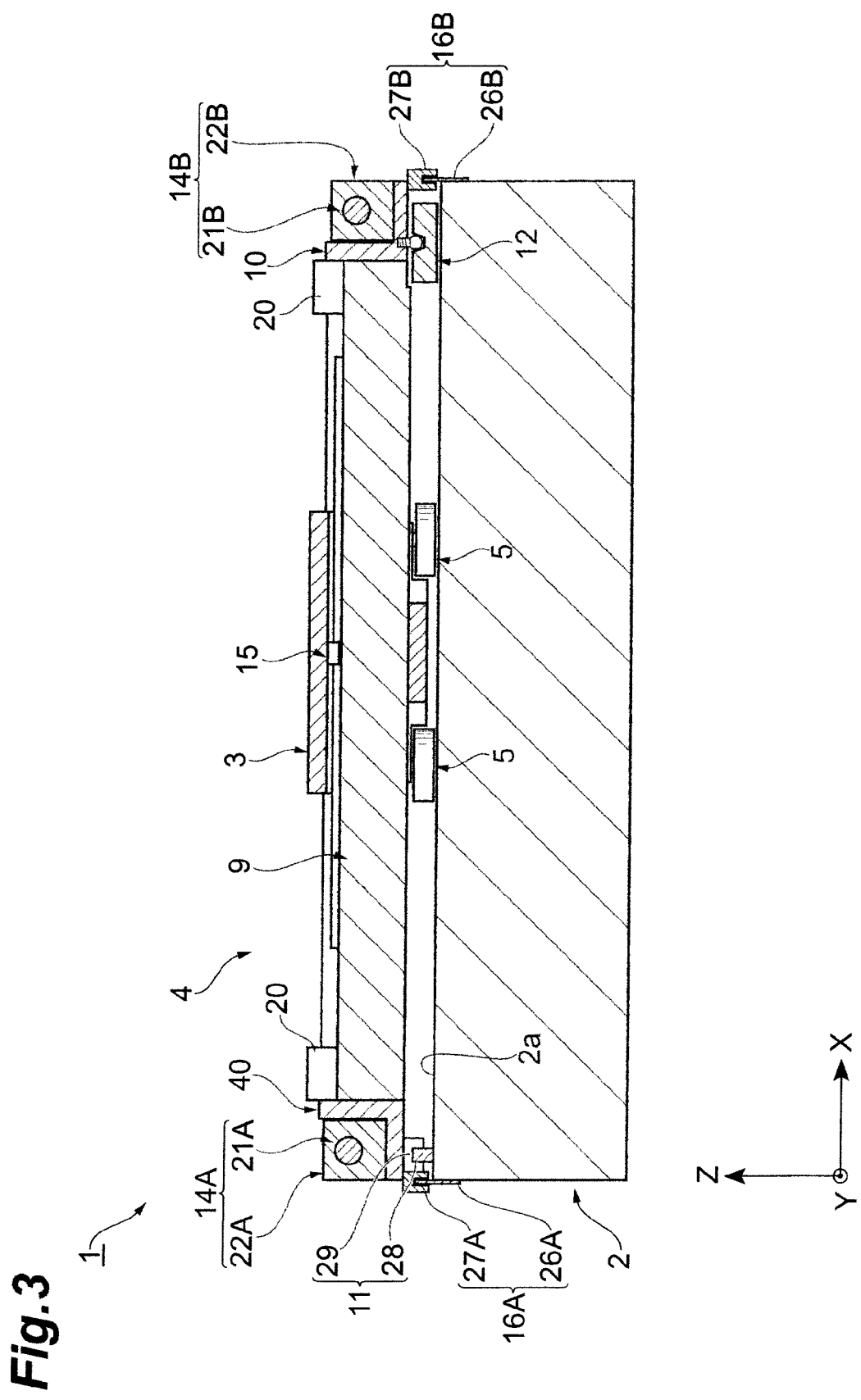
FIG. 3 is a sectional view taken along a line of FIG. 1.
Figure 4:
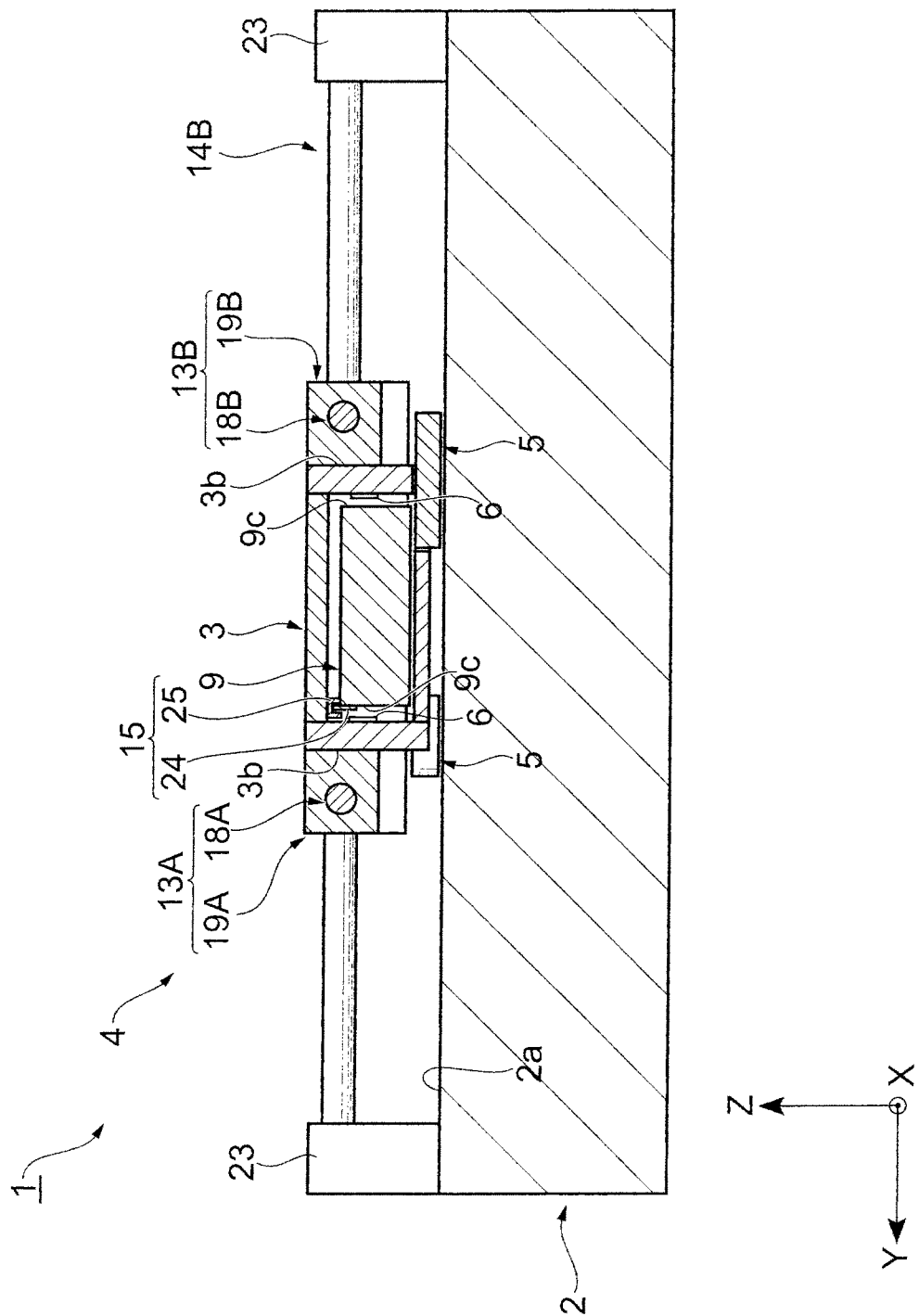
FIG. 4 is a sectional view taken along a line IV-IV of FIG. 1.
Figure 5:
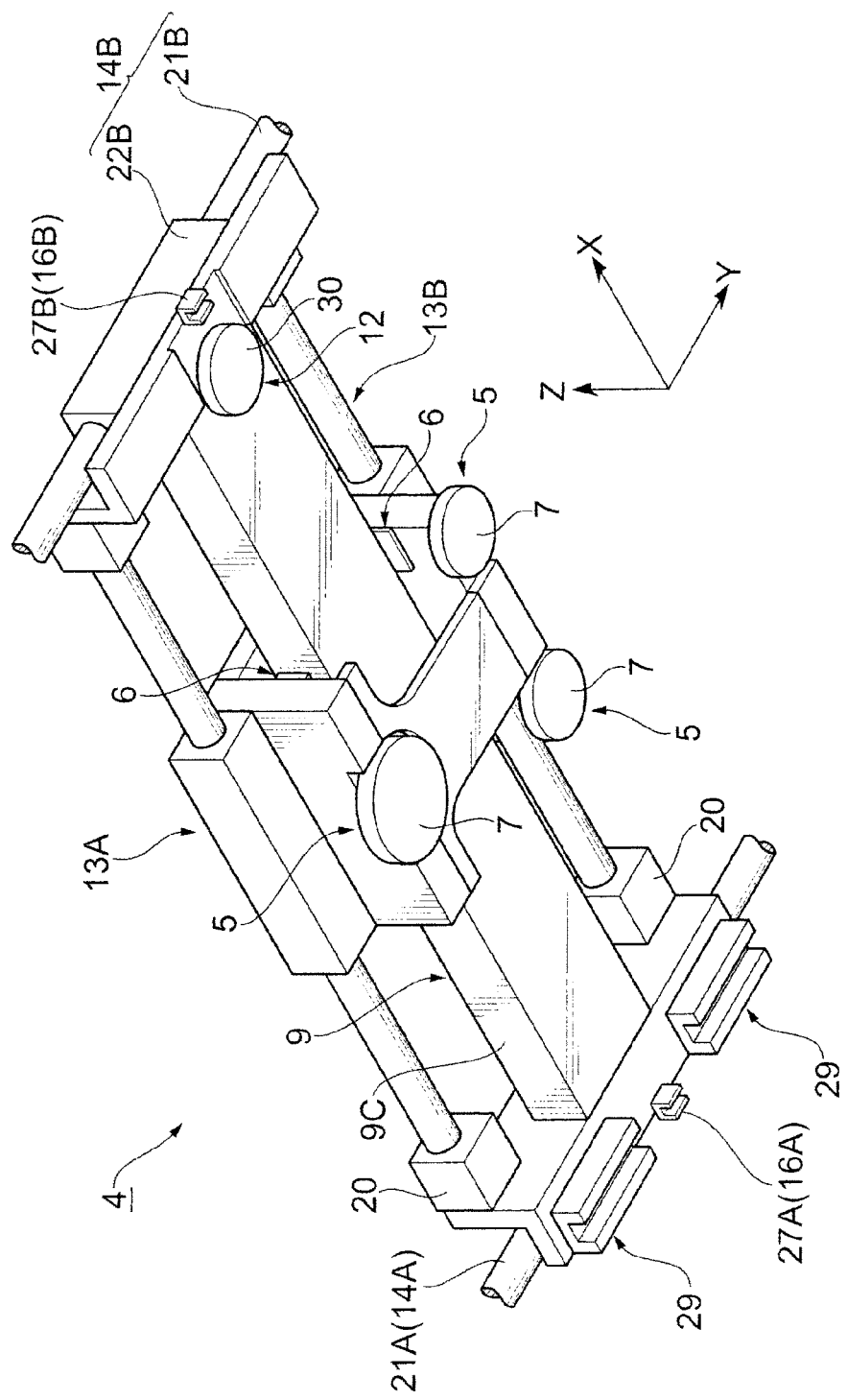
FIG. 5 is a perspective view showing the platen side of a Y-axis movable body of FIG. 1.

FIG. 1 is a perspective view showing an XY stage device according to one embodiment of the present invention, FIG. 2 is a side view showing the XY stage device of FIG. 1, FIG. 3 is a sectional view taken along a line III-III of FIG. 1, FIG. 4 is a sectional view taken along a line IV-IV of FIG. 1, and FIG. 5 is a perspective view showing the platen side of a Y-axis movable body of FIG. 1.

As shown in FIGS. 1 to 3, an XY stage device 1 of the present embodiment is used for a semiconductor inspection apparatus for inspecting a semiconductor, or a semiconductor exposure apparatus for exposing a semiconductor. The stage device 1 includes a platen 2, an X-axis movable body 3, and a Y-axis movable body 4, and is a so-called surface type stage in which both the X-axis movable body 3 and the Y-axis movable body 4 are supported by the platen 2 to move on the platen 2.

The platen 2 has a rectangular shape, and is formed from stone. A platen surface 2a of the platen 2 is subjected to flattening, and the flatness thereof is enhanced.

The X-axis movable body 3 has a plate shape with a rectangle annular cross-section, and moves to the X-axis direction which is one direction in the horizontal direction on the platen 2. As shown in FIG. 5, the X-axis movable body 3 is supported by X-axis lift air pads 5 attached to the bottom surface of the X-axis movable body in non-contact in a Z-axis direction which is a direction perpendicular to the platen surface 2a, and is made slidable in non-contact on the platen surface 2a.

As shown in FIG. 4, the X-axis movable body 3 is constructed so as to be fitted on a guide beam 9 (which will be described later) of the Y-axis movable body 4, and sandwich both side surfaces 9c and 9c of the guide beam 9 in non-contact by yaw air pads 6 provided at the inner surface of the X-axis movable body. This makes the X-axis movable body 3 movable along the guide beam 9 and movable along the X-axis direction.

The X-axis lift air pads 5 function as gas hydrostatic bearings which jet gas towards the platen 2, and as shown in FIG. 5, and three X-axis lift air pads are provided to support the X-axis movable body 3 in a static state in order to enhance the stability degree thereof. The preload of each X-axis lift air pad 5 is made adjustable. Specifically, the X-axis lift air pads can be vacuum-sucked on the platen surface 2a with desired suction power by suction holes (not shown) formed in the bottom surface of a pad portion 7 of each X-axis lift air pad 5. This suppresses the displacement of the X-axis movable body 3 in the Z-axis direction.

The yaw air pads 6 function as gas hydrostatic bearings which jet gas towards the guide beam 9, and two pairs (a total of four) of yaw air pads are provided at positions which face each other via the guide beam 9 at the inner surface of the X-axis movable body 3.

Returning to FIG. 1, the Y-axis movable body 4 moves in the Y-axis direction which is a direction orthogonal to the X-axis direction in the horizontal direction on the platen 2, and guides the movement of the X-axis movable body 3 in the X-axis direction. The Y-axis movable body 4 includes a columnar guide beam 9 which extends in the X-axis direction, and a pair of stays 10 respectively provided at both ends of the guide beam 9 in the X-axis direction.

The guide beam 9 assumes a rectangular sectional shape, and is inserted into the X-axis movable body 3. The guide beam 9 guides the movement of the X-axis movable body 3 along the X-axis direction.

By a rolling guide (one of supporting means) 11, one end (left end in the drawing) of the Y-axis movable body 4 in the X-axis direction is brought into contact with and supported by the platen surface 2a in the Z-axis direction, and the movement thereof in the Y-axis direction is guided. Additionally, as shown in FIGS. 2 and 3, by a Y-axis lift air pad (an air pad or the other of the supporting means) 12, the other end (right end in the drawing) of the Y-axis movable body 4 in the X-axis direction is supported by the platen surface 2a in non-contact in the Z-axis direction, and is made slidable on the platen surface 2a in non-contact.

Additionally, as shown in FIG. 1, the XY stage device 1 includes a pair of X-axis shaft motors 13A and 13B, a pair of Y-axis shaft motors (shaft motors or driving means) 14A and 14B, an X-axis linear scale 15, a pair of Y-axis linear scales (linear scales or detecting means) 16A and 16B, and a controller (control means) 17.

The X-axis shaft motors 13A and 13B are for driving the X-axis movable body 3 in the X-axis direction, and are arranged so as to be separated from each other in the Y-axis direction. The X-axis shaft motors 13A and 13B respectively include X-axis shaft portions 18A and 18B as stators, and a pair of X-axis coil portions 19A and 19B as movers. The X-axis shaft portions 18A and 18B have a magnet therein, and respectively extend along the X-axis direction at outside positions in the Y-axis direction with respect to the X-axis movable body 3. The X-axis shaft portions 18A and 18B are respectively fixed to fixed blocks 20 provided in the stays 10 of the Y-axis movable body 4, and are fixed to the Y-axis movable body 4.

As shown in FIG. 4, the X-axis coil portions 19A and 19B move along the X-axis shaft portions 18A and 18B, respectively, and have coils surrounding the X-axis shaft portions 18A and 18B therein, respectively. The X-axis coil portions 19A and 19B are fitted on the X-axis shaft portions 18A and 18B, respectively, and are fixed to side surfaces 3b and 3b of the X-axis movable body 3 along the X-axis direction. Thereby, in the X-axis shaft motors 13A and 13B, when a predetermined current is applied to the X-axis coil portions 19A and 19B, the X-axis coil portions 19A and 19B are moved in the X-axis direction by electromagnetic interaction, and as a result, the X-axis movable body 3 is moved in the X-axis direction.

As shown in FIG. 1, the Y-axis shaft motors 14A and 14B are for driving the Y-axis movable body 4 in the Y-axis direction, and are arranged so as to be separated from each other in the X-axis direction. The Y-axis shaft motors 14A and 14B respectively include Y-axis shaft portions 21A and 21B as stators, and Y-axis coil portions 22A and 22B as movers. The Y-axis shaft portions 21A and 21B have a magnet therein, and extend along the Y-axis direction, respectively, so that spaces A1 and A2 are formed between the Y-axis shaft portions and the platen surface 2a of the platen 2 at both ends in the X-axis direction on the platen 2. The Y-axis shaft portions 21A and 21B are respectively fixed to fixed blocks 23 provided at four corners of the platen 2, and are directly fixed to the platen 2.

As shown in FIG. 3, the Y-axis coil portions 22A and 22B move along the Y-axis shaft portions 21A and 21B, respectively, and have coils surrounding the Y-axis shaft portions 21A and 21B therein, respectively. The Y-axis coil portions 22A and 22B are fitted on the Y-axis shaft portions 21A and 21B, respectively, and are fixed to the stays 10 and 10, respectively, of the Y-axis movable body 4. Thereby, in the Y-axis shaft motors 14A and 14B, when a predetermined current is applied to the Y-axis coil portions 22A and 22B, the Y-axis coil portions 22A and 22B are moved in the Y-axis direction by electromagnetic interaction, and as a result, the Y-axis movable body 4 is moved in the Y-axis direction. Additionally, when a predetermined current is applied to the Y-axis coil portions 22A and 22B so that the Y-axis shaft motors 14A and 14B cooperate with each other, the Y-axis coil portions 22A and 22B are moved in mutually different directions in the Y-axis direction, and as a result, the Y-axis movable body 4 rotates in the direction of yawing.

The X-axis linear scale 15 has a scale 24 and a scale head 25. The scale 24 is attached to one side surface 9c of the guide beam 9 along the X-axis direction, and optical scale marks are engraved on the scale. The scale head 25 is attached to a position corresponding to the scale 24 in the X-axis movable body 3, and for example, receives the reflected light of a laser beam which is radiated to the optical scale marks of the scale 24, and acquires a signal according to the positional relationship with the scale 24. Thereby, in the X-axis linear scale 15, the position of the X-axis movable body 3 in the X-axis direction is detected on the basis of this signal.

As shown in FIG. 3, the Y-axis linear scales 16A and 16B are arranged so as to be separated from each other in the X-axis direction, and respectively have scales 26A and 26B and scale heads 27A and 27B, similarly to the above X-axis linear scale 15. The scales 26A and 26B are respectively attached along the Y-axis direction at both ends of the platen 2 in the X-axis direction, and optical scale marks are engraved on the scales. The scale heads 27A and 27B are attached to positions corresponding to the scales 26A and 26B in the respective stays 10 of the Y-axis movable body 4, and for example, receive the reflected light of a laser beam which is radiated to the optical scale marks of the scales 26A and 26B, and acquire a signal according to the positional relationship with the scales 26A and 26B.

Thereby, in the Y-axis linear scales 16A and 16B, the X-axis direction position of the X-axis movable body 3 is detected on the basis of this signal, and the yawing angle (yaw error, and rotational error) of the Y-axis movable body 4 is detected on the basis of a difference in the position of the detected Y-axis movable body 4.

As shown in FIG. 1, the controller 17 is composed of, for example, a CPU, a ROM, RAM, etc. The controller 17 is for controlling the operation of the XY stage device 1, and controls the driving of the X-axis shaft motors 13A and 13B on the basis of the X-axis direction position of the X-axis movable body 3 detected on the X-axis linear scale 15. Along with this, the controller controls the driving of the Y-axis shaft motors 14A and 14B on the basis of the Y-axis direction position and yawing angle of the Y-axis movable body 4 detected on the Y-axis linear scales 16A and 16B (the details of which will be described later).

Here, the rolling guide 11 and a Y-axis lift air pad 12 will be described in detail below.

Figure 6:
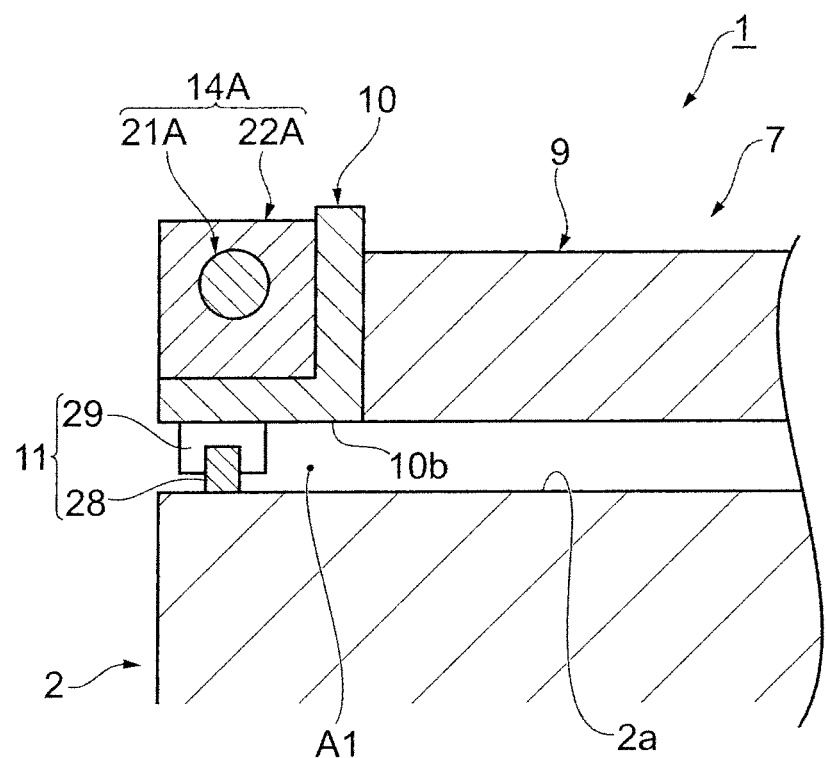
FIG. 6 is an enlarged schematic cross-section taken along the line of FIG. 1 for showing a rolling guide of FIG. 1.
Figure 7:
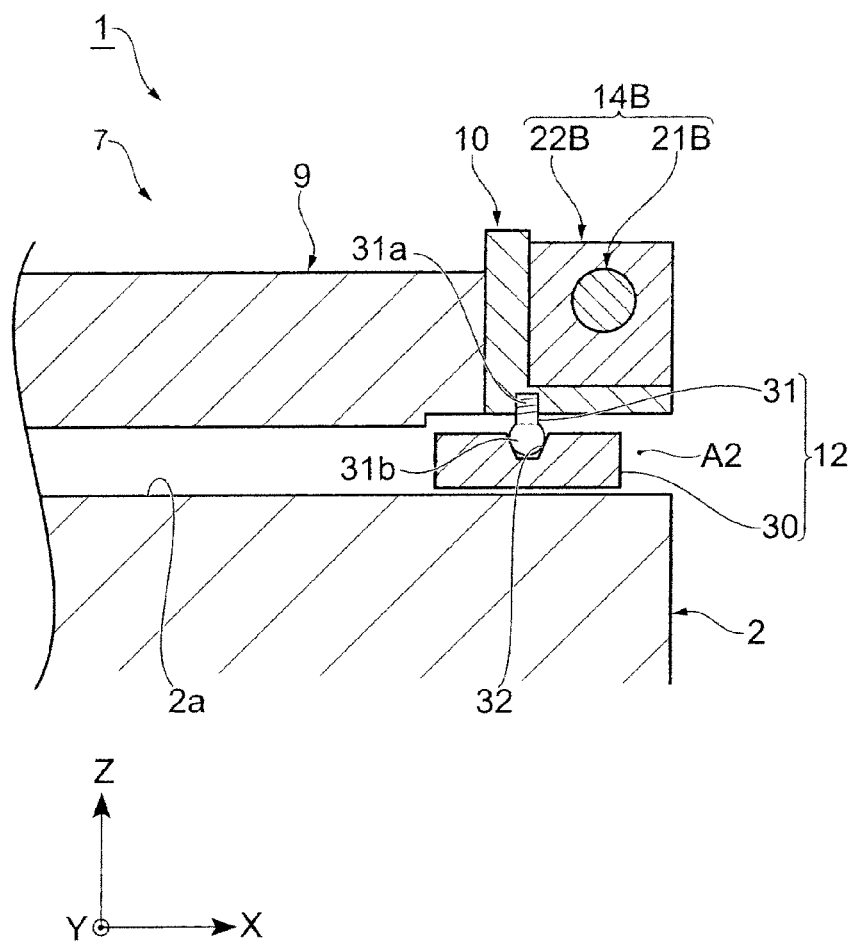
FIG. 7 is an enlarged schematic cross-section taken along the line of FIG. 1 for showing Y-axis lift air pads of FIG. 1.

FIG. 6 is an enlarged schematic cross-section taken along the line III-III of FIG. 1 for showing the rolling guide of FIG. 1, and FIG. 7 is an enlarged schematic cross-section taken along the line of FIG. 1 for showing the Y-axis lift air pads of FIG. 1.

As shown in FIG. 6, the rolling guide 11 is of a contact type which supports and guides one end of the Y-axis movable body 4 in the X-axis direction so as to come into contact with the platen 2, and includes a guide rail 28 and a runner block 29.

The guide rail 28 extends along the Y-axis direction in one end of the platen surface 2a of the platen 2 in the X-axis direction. Specifically, the guide rail 28 extends between the fixed blocks 23 and 23 on the platen 2 so as to be located closer to the platen 2 than the Y-axis shaft portion 21A of the Y-axis shaft motor 14A, that is, so as to enter the space A1 between the Y-axis shaft portion 21A and the platen 2 (refer to FIG. 1). In other words, the Y-axis shaft portion 21A is arranged on the guide rail 28.

The runner block 29 assumes a U-shaped cross-section which is opened downward, and two runner blocks are provided side by side along the Y-axis direction on a bottom surface 101) of the stay 10 so as to be located closer to the platen 2 than the Y-axis shaft portion 21A of the Y-axis shaft motor 14A, that is, so as to enter the space A1 between the Y-axis shaft portion 21A and the platen 2 (refer to FIG. 5). In other words, the Y-axis shaft portion 21A is arranged on the runner block 29.

The runner block 29 has provided therein rollers or balls (not shown) for sliding on the guide rail 28, and is slidably engaged with the guide rail 28. Thereby, the rolling guide 11 guides one end, in the X-axis direction, of the Y-axis movable body 4 in the Y-axis direction while constraining the one end in the X-axis direction and in the Z-axis direction.

Additionally, in the rolling guide 11, the cross-sectional area, length, material, etc. of the guide rail 28 and the runner block 29 are suitably selected, and the rigidity thereof in the direction of yawing is suitably set. Thereby, a predetermined elastic force of the Y-axis movable body 4 in the direction of yawing is obtained in order to preferably control the yawing angle of the Y-axis movable body 4.

As shown in FIG. 7, the Y-axis lift air pad 12 functions as a gas hydrostatic bearing which jets gas towards the platen 2, and one Y-axis lift air pad is provided at the other end of the Y-axis movable body 4 in X-axis direction. The Y-axis lift air pad 12 has a pad portion 30 and a supporting portion 31.

The pad portion 30 is provided so that a portion thereof is located closer to the platen 2 than the Y-axis shaft portion 21B of the Y-axis shaft motor 14B. That is, the Y-axis lift air pad 12 is provided so that at least a portion thereof enters the space A2 between the Y-axis shaft portion 21B and the platen 2. In other words, the Y-axis shaft portion 21B is arranged on the pad portion 30.

The supporting portion 31 is a shaft body which has the Z-axis direction as its axis direction, and connects the Y-axis movable body 4 and the pad portion 30 together. A tip portion 31a of the supporting portion 31 at the Y-axis movable body 4 is connected to the Y-axis movable body 4 by, for example, screwing. This enables the lift amount (supporting height) of the Y-axis lift air pad 12 to be adjusted.

On the other hand, a tip portion 31b of the supporting portion 31 at the pad portion 30 is connected to the pad portion 30 by, for example spherical surface support and joining. Specifically, the tip portion 31b has a turning sphere, and this turning sphere is slidably fitted to a spherical seat 32 which is depressed in a conical shape. Thereby, the spherical surface support of the Y-axis movable body 4 is performed by the Y-axis lift air pad 12.

Additionally, the preload of the Y-axis lift air pad 12 is made adjustable, similarly to the above X-axis lift air pads 5. Specifically, as shown in FIG. 5, the Y-axis lift air pad can be vacuum-sucked on the platen surface 2a by suction holes (not shown) formed in the bottom surface of the pad portion 30 with desired suction power, and the displacement of the Y-axis movable body 4 in the Z-axis direction is suppressed.

In the XY stage device 1 constructed as described above, when the X-axis movable body 3 is moved to a predetermined position in the X-axis direction, the X-axis direction position of X-axis movable body 3 is detected by the X-axis linear scale 15. Driving currents to be applied to the X-axis coil portions 19A and 19B of the X-axis shaft motors 13A and 13B on the basis of this detection value is controlled by the controller 17. Thereby, the X-axis movable body 3 which is supported in non-contact with the platen surface 2a by the X-axis lift air pad 5 is guided in non-contact with the guide beam 9 by the yaw air pad 6, and is moved in the X-axis direction so as to slide on the platen surface 2a.

Additionally, when the Y-axis movable body 4 is moved to a predetermined position in the Y-axis direction, the Y-axis direction position of the Y-axis movable body 4 is detected by the Y-axis linear scales 16A and 16B. Driving currents to be applied to the Y-axis coil portions 22A and 22B of the Y-axis shaft motors 14A and 14B on the basis of these detection values is controlled by the controller 17. Thereby, the Y-axis movable body 4 one end of which the X-axis direction is brought into contact with and supported by the rolling guide 11, and the other end of which in the X-axis direction is supported in non-contact by Y-axis lift air pad 12 is brought into contact with and guided by the rolling guide 11 at one end thereof in the X-axis direction, and is moved in the Y-axis direction so as to slide on the platen surface 2a.

Here, in the XY stage device 1, on the basis of the yawing angle detected by the Y-axis linear scales 16A and 16B, the Y-axis shaft motors 14A and 14B are cooperated with each other, and the Y-axis movable body 4 is moved in a rotational direction around the Z-axis (hereinafter referred to as "the direction of yawing"). Specifically, driving currents are applied to the Y-axis coil portions 22A and 22B, respectively, so that the detected yawing angle becomes 0 (the yawing error is canceled), the difference is added to the thrusts of the Y-axis coil portions 22A and 22B, and the Y-axis movable body 4 is rotated in the direction of yawing. As a result, the Y-axis movable body 4 is held so that the yawing angle does not change from the state of 0 even when the X-axis movable body 3 is moved in the X-axis direction and even when the Y-axis movable body 4 is moved in the Y-axis direction.

As described above, in the present embodiment, the Y-axis shaft motors 14A and 14B which drive the Y-axis movable body 4 in the Y-axis direction are cooperatively controlled by the controller 17 on the basis of the detected yawing angle. Hence, it is possible to make the Y-axis shaft motors 14A and 14B cooperate with each other according to the detected yawing angle, and to control the yawing angle of the Y-axis movable body 4 as desired. That is, it is possible to perform yawing control to improve yawing precision.

In addition, as described above, one end of the Y-axis movable body 4 in the X-axis direction is supported by the rolling guide 11, and the other end thereof is supported by the Y-axis lift air pad 12. Hence, since one side of the Y-axis movable body 4 is not completely constrained (is brought into a free state) in the X-axis direction, it is possible to avoid and suppress (allow) deformation such as strain or warpage caused by, for example, thermal stress. Hence, in the present embodiment, the structure for avoidance caused by thermal expansion can be realized, and the deformation of the Y-axis movable body 4 by thermal expansion can be reduced. As a result, the deformation of the guide beam 9 of the Y-axis movable body 4 is suppressed, and the running precision of the X-axis movable body 3 guided by the guide beam 9, i.e.,
performance, such as straightness and angle during movement of the X-axis movable body 3, can be enhanced.

Additionally, in the present embodiment, as described above, the yawing angle of the Y-axis movable body 4 is detected using the pair of Y-axis linear scales 16A and 16B which are provided so as to be separated from each other in the X-axis direction. Hence, the Y-axis direction position of the Y-axis movable body 4 can be detected, and the yawing angle can be detected on the basis of the difference between the detection values. Additionally, it is not necessary to separately provide an instrument which detects the yawing angle, and it is possible to easily detect the position and yawing angle of the Y-axis movable body 4.

Especially when the pair of Y-axis linear scales 16A and 16B is used, the intermediate position of the Y-axis movable body 4 between the linear scales (that is, the middle position of the Y-axis movable body 4) can be also detected with high precision. This effect becomes remarkable when the XY stage device 1 is used for a semiconductor inspection apparatus or a semiconductor exposure apparatus as in the present embodiment. This is because an optical system for inspection or exposure is generally arranged on the middle position of the Y-axis movable body 4 in the semiconductor inspection apparatus or the semiconductor exposure apparatus.

Additionally, in the Y-axis lift air pad 12 of the present embodiment, as described above, the supporting height is made adjustable. Therefore, adjustment can be easily made so that the height of the Y-axis movable body 4 at the Y-axis lift air pad 12 (other end) becomes equal to the height of the Y-axis movable body 4 at the rolling guide 11 (one end). As a result, it is possible to easily adjust and hold the horizontal state of the Y-axis movable body 4.

Additionally, in the present embodiment, as described above, the Y-axis lift air pad 12 is constructed so as to perform the spherical surface support of the Y-axis movable body 4, and the Y-axis lift air pad 12 and the Y-axis movable body 4 are made rotatable to each other. Therefore, the strain, warpage, etc. which are caused in the Y-axis movable body 4 can be further avoided, the running precision of the X-axis movable body 3 can be further enhanced, and the Y-axis lift air pad 12 can be easily attached or adjusted to the Y-axis movable body 4.

Additionally, in the rolling guide 11 of the present embodiment, as described above, the rigidity in the direction of yawing is suitably set so that the predetermined elastic force of the Y-axis movable body 4 in the direction of yawing is obtained. Therefore, it is possible to suitably control the yawing angle of the Y-axis movable body 4. Hence, the rolling guide 11 which has proper rigidity can be selected, and the yawing precision can be improved. In addition, if the rigidity of the rolling guide 11 in the direction of yawing becomes too high, the thrusts of the Y-axis shaft motors 14A and 14B do not overcome this rigidity, and control of the yawing angle becomes difficult. Therefore, it can be said that the rigidity of the rolling guide 11 in the direction of yawing is an important factor in regard to the yawing control.

Additionally, the following operational effects are also exhibited in the present embodiment. That is, as described above, a portion of the rolling guide 11 and a portion of the Y-axis lift air pad 12 enter the spaces A1 and A2 between the Y-axis shaft portions 21A and 21B in the Y-axis shaft motors 14A and 14B and the platen 2, respectively. Therefore, a space configuration by including the Y-axis shaft motors 14A and 14B becomes suitable. For example, compared to a related-art stage device where the Y-axis shaft motors 14A and 14B should be arranged on the side surfaces of the platen 2, the footprint (the installation area of the XY stage device 1) can be decreased, and the stage device can be further miniaturized.

Incidentally, the XY stage device 1 of the present embodiment, as described above, is a surface type stage device in which both the X-axis movable body 3 and the Y-axis movable body 4 are supported by the platen 2, and the movement of the X-axis movable body 3 is guided by the Y-axis movable body 4. Consequently, compared to the stage device (a so-called stack-type moving stage device) in which the X-axis movable body 3 is supported and moved on the Y-axis movable body 4, the structural top footprint of the XY stage device 1 increases, and the stage device is apt to be enlarged in the horizontal direction. Hence, the above effect of making the footprint small to realize further miniaturization is especially effective for the surface type stage device like the XY stage device 1.

Additionally, in the present embodiment, the supporting of the Y-axis movable body 4 with respect to the platen 2 is three-point supporting including two runner blocks 29 and one Y-axis lift air pad 12 and is brought into a static state. Therefore, the stability degree of the Y-axis movable body 4 is enhanced.

Although a preferred embodiment of the invention has been described, the present invention is not limited to the above embodiment.

For example, the above embodiment is the XY stage device 1 including the X-axis movable body 3 and the Y-axis movable body 4.

However, there may be adopted an XYZ stage device further including a Z-axis movable body which is provided on the X-axis movable body 3 and moves in a Z-axis direction, an XYθ stage device further including a θ-axis movable body which is provided on the axis movable body 3 and rotates in a rotational direction around the Z-axis (θz), and an XYZθ stage device further including the Z-axis movable body and the θ-axis movable body.

Additionally, in the above embodiment, the pair of Y-axis linear scales 16A and 16B are used as the detecting means. However, other detecting means may be adopted as long as the yawing angle of the Y-axis movable body 4 can be detected. Additionally, the pair of Y-axis shaft motors 14A and 14B is used as the driving means. However, the present invention is not limited thereto, and a pair of driving means, which is provided so as to be separated from each other in the X-axis direction and drive the Y-axis movable body 4 in the Y-axis direction, may be adopted.

Additionally, in the above embodiment, a portion of the rolling guide 11 and a portion of the Y-axis lift air pad 12 enter the space A1 and A2, respectively. However, at least portions of any of the rolling guide 11 and the Y-axis lift air pad 12 may enter the space A1 and A2, respectively. Additionally, although the rolling guide 11 completely enters the space A1 between the Y-axis shaft portion 21A and the platen 2, at least the portion of the rolling guide may enter the space.

In addition, the XY stage device of the invention can be applied not only to the above-described semiconductor inspection apparatus or semiconductor exposure apparatus but also to various apparatuses.

It should be understood that the invention is not limited to the above-described embodiment, but may be modified into various forms on the basis of the spirit of the invention. Additionally, the modifications are included in the scope of the invention.

What is claimed is:

1. An XY stage device having an X-axis movable body which moves in an X-axis direction on a platen, and a Y-axis movable body which moves in a Y-axis direction on the platen and guides the movement of the X-axis movable body in the X-axis direction, comprising:
a pair of actuators which is provided so as to be separated from each other in the X-axis direction, and drives the Y-axis movable body in the Y-axis direction;
a detector which detects a yawing angle that is the angle of the Y-axis movable body in a rotational direction around a Z-axis;
a controller which controls the driving of the pair of actuators on the basis of the yawing angle detected by the detector; and
a pair of supporters which supports the Y-axis movable body on the platen,
wherein one of the pair of supporters is a guide which is a contact type which supports and guides the movement of the Y-axis movable body so as to come into contact with the platen in the Y-axis direction, and the other of the pair of supporters is an air pad which supports the Y-axis movable body in non-contact with the platen.

2. The XY stage device according to claim 1, wherein the controller controls the driving of the pair of actuators so that the yawing angle becomes 0.

3. The XY stage device according to claim 1, wherein the detector is a pair of linear scales which is provided so as to be separated from each other in the X-axis direction, and detects the position of the Y-axis movable body in the Y-axis direction.

4. The XY stage device according to claim 1, wherein the pair of actuators is a pair of shaft motors.

5. The XY stage device according to claim 1, wherein the air pad is constructed so that the supporting height thereof can be adjusted.

6. The XY stage device according to claim 1, wherein the air pad is constructed so as to perform a spherical surface support of the Y-axis movable body.

7. The XY stage device according to claim 1, further comprising a semiconductor inspection apparatus.

8. The XY stage device according to claim 1, further comprising a semiconductor exposure apparatus.

* * * * *